(12) United States Patent
Wang et al.

(10) Patent No.: US 10,714,598 B2
(45) Date of Patent: Jul. 14, 2020

(54) METHOD OF MANUFACTURING SEMICONDUCTOR DEVICE

(71) Applicant: TAIWAN SEMICONDUCTOR MANUFACTURING CO., LTD., Hsinchu (TW)

(72) Inventors: Tsan-Chun Wang, Hsinchu (TW); Chun-Feng Nieh, Hsinchu (TW); Chiao-Ting Tai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/801,128

(22) Filed: Nov. 1, 2017

(65) Prior Publication Data
US 2019/0006492 A1    Jan. 3, 2019

Related U.S. Application Data

(60) Provisional application No. 62/527,783, filed on Jun. 30, 2017.

(51) Int. Cl.
*H01L 29/66* (2006.01)
*H01L 21/266* (2006.01)
(Continued)

(52) U.S. Cl.
CPC ...... *H01L 29/66803* (2013.01); *H01L 21/266* (2013.01); *H01L 21/26506* (2013.01);
(Continued)

(58) Field of Classification Search
CPC ......... H01L 29/66803; H01L 21/26513; H01L 21/266; H01L 29/7848; H01L 29/517;
(Continued)

(56) References Cited

U.S. PATENT DOCUMENTS

| 8,445,340 B2 | 5/2013 | Lee et al. |
| 2006/0208203 A1 | 9/2006 | Gupta et al. |

(Continued)

FOREIGN PATENT DOCUMENTS

| CN | 105810729 A | 7/2016 |
| KR | 10-2008-0018224 A | 2/2008 |

(Continued)

OTHER PUBLICATIONS

Tse, K., et al., "Defect passivation in HfO2 gate oxide by fluorine", Appl. Phys. Lett. 89, 142914 (2006).

*Primary Examiner* — Bac H Au
(74) *Attorney, Agent, or Firm* — McDermott Will & Emery LLP

(57) ABSTRACT

In a method for manufacturing a semiconductor device, fin structures each having an upper portion and a lower portion, are formed. The lower portion is embedded in an isolation insulating layer disposed over a substrate and the upper portion protrudes the isolation insulating layer. A gate dielectric layer is formed over the upper portion of each of the fin structures. A conductive layer is formed over the gate dielectric layer. A cap layer is formed over the conductive layer. An ion implantation operation is performed on the fin structures with the cap layer. The ion implantation operation is performed multiple times using different implantation angles to introduce ions into one side surface of each of the fin structures.

20 Claims, 14 Drawing Sheets

(51) Int. Cl.
*H01L 21/265* (2006.01)
*H01L 29/78* (2006.01)
*H01L 21/28* (2006.01)
*H01L 29/51* (2006.01)
*H01L 29/49* (2006.01)

(52) U.S. Cl.
CPC .. *H01L 21/26513* (2013.01); *H01L 21/26586* (2013.01); *H01L 21/28176* (2013.01); *H01L 29/66545* (2013.01); *H01L 29/785* (2013.01); *H01L 29/4966* (2013.01); *H01L 29/513* (2013.01); *H01L 29/517* (2013.01); *H01L 29/7848* (2013.01)

(58) Field of Classification Search
CPC ............... H01L 29/513; H01L 29/4966; H01L 21/28176; H01L 21/26586; H01L 21/26506; H01L 29/785; H01L 29/66545; H01L 29/7855; H01L 29/66742; H01L 21/265
See application file for complete search history.

(56) References Cited

U.S. PATENT DOCUMENTS

| | | | |
|---|---|---|---|
| 2006/0234431 A1* | 10/2006 | Yeo | H01L 21/26586 438/157 |
| 2008/0274600 A1* | 11/2008 | Mathew | H01L 21/26586 438/283 |
| 2009/0267161 A1* | 10/2009 | Pillarisetty | H01L 29/66545 257/402 |
| 2011/0156145 A1* | 6/2011 | Radosavljevic | H01L 21/28079 257/347 |
| 2014/0054679 A1* | 2/2014 | Tang | H01L 21/26586 257/329 |
| 2015/0187915 A1* | 7/2015 | Joo | H01L 29/66803 438/289 |
| 2016/0133469 A1* | 5/2016 | Wan | H01L 21/26586 438/525 |
| 2016/0163546 A1* | 6/2016 | Godet | H01L 21/82343 438/404 |
| 2016/0276344 A1 | 9/2016 | Choi et al. | |
| 2016/0358911 A1 | 12/2016 | Chen et al. | |

FOREIGN PATENT DOCUMENTS

| | | |
|---|---|---|
| KR | 10-2016-01122778 A | 9/2016 |
| KR | 10-2016-0143482 A | 12/2016 |
| TW | 201118952 A | 6/2011 |
| TW | 201413795 A | 4/2014 |
| TW | 201709286 A | 3/2017 |

* cited by examiner

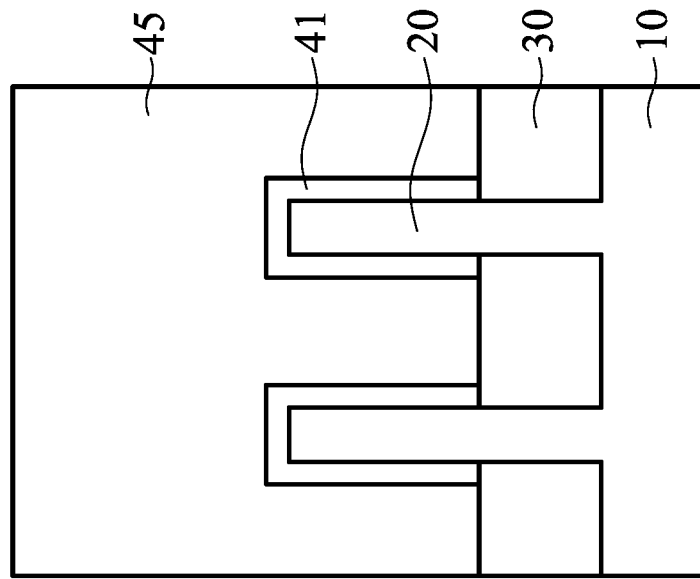
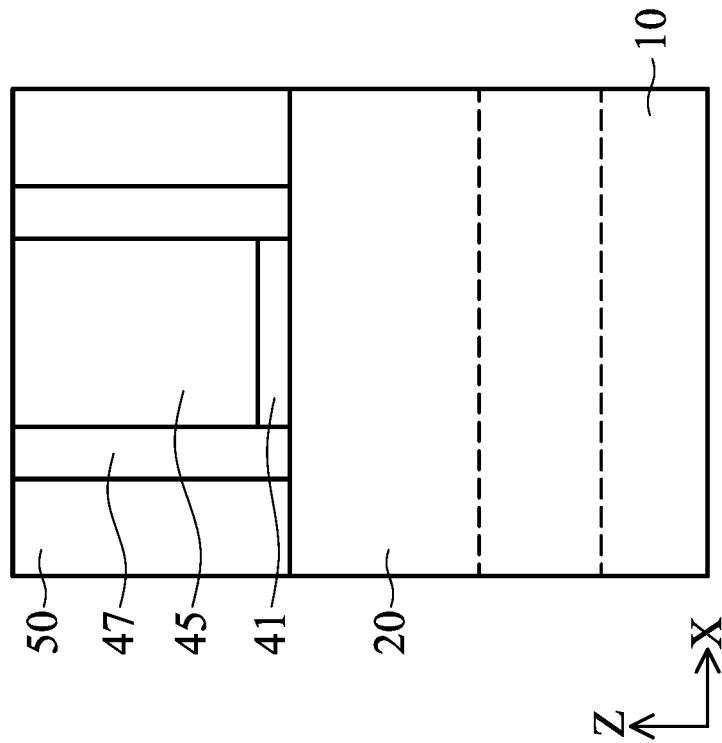
FIG. 4A
FIG. 4B

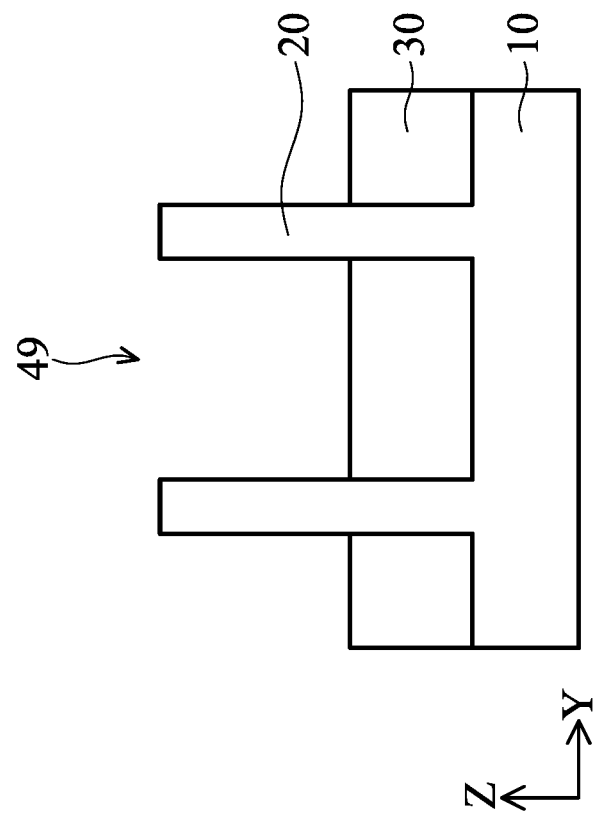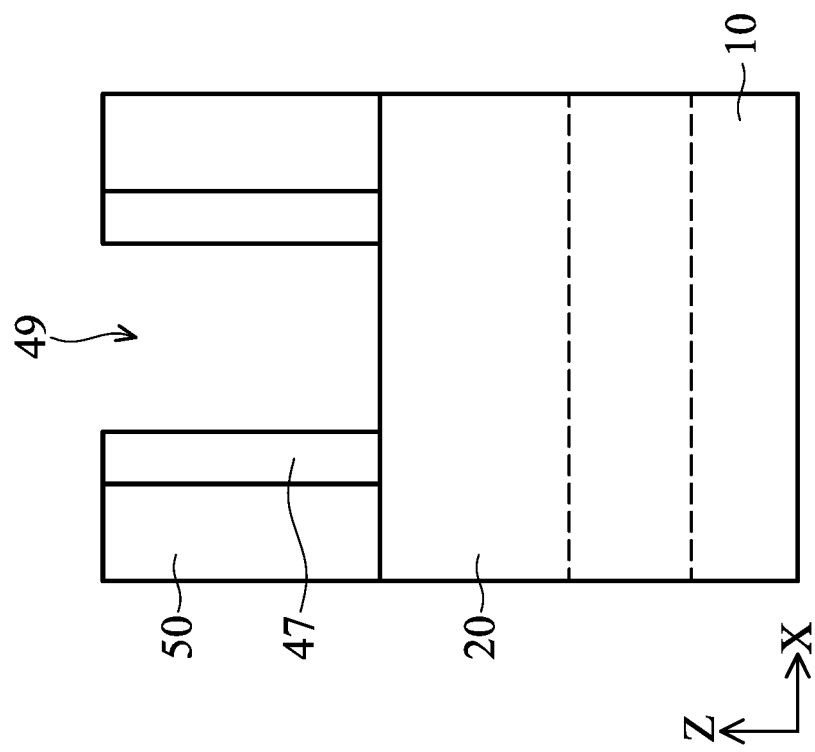

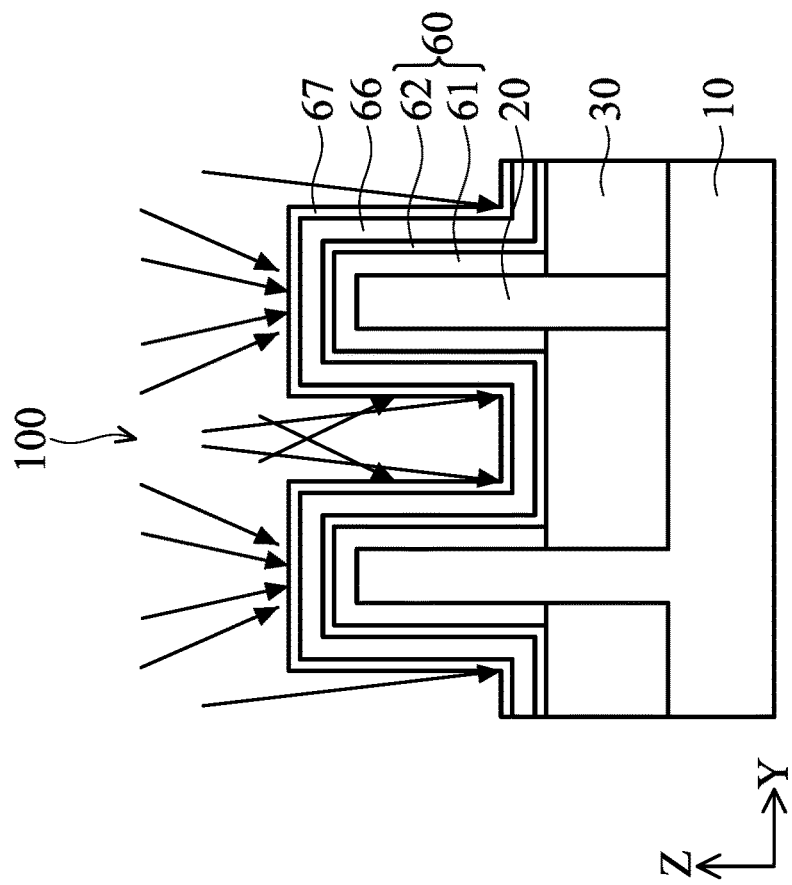
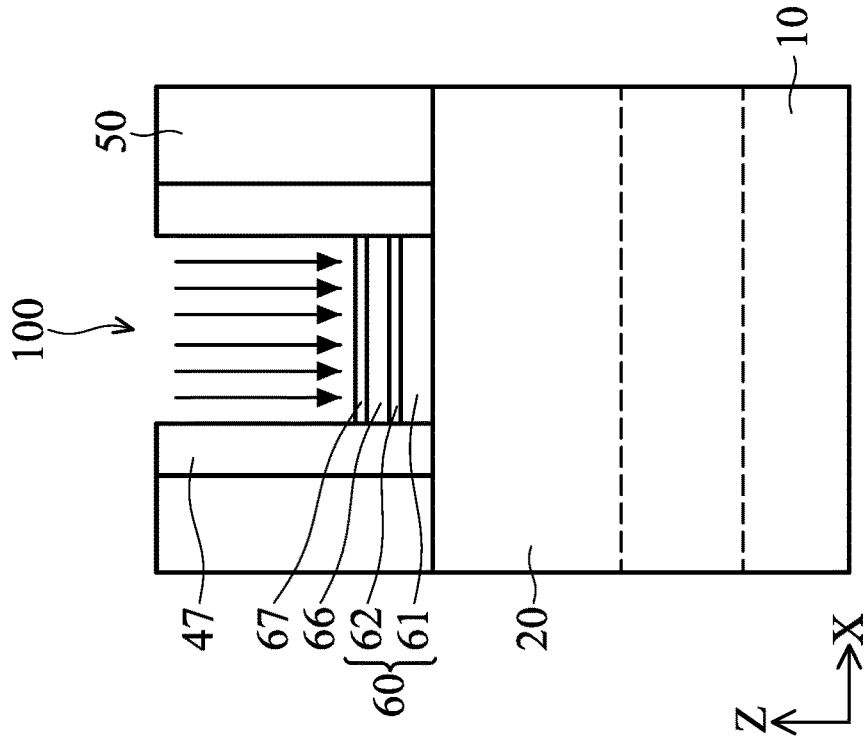
FIG. 8B
FIG. 8A

METHOD OF MANUFACTURING SEMICONDUCTOR DEVICE

This application claims priority of Provisional Application No. 62/527,783 filed on Jun. 30, 2017, the entire contents of which are incorporated herein by reference.

TECHNICAL FIELD

The disclosure relates to methods of manufacturing semiconductor integrated circuits, and more particularly to a method of manufacturing semiconductor devices including fin field effect transistors (FinFETs).

BACKGROUND

With increasing down-scaling of integrated circuits and increasingly demanding requirements of speed of integrated circuits, transistors need to have higher drive currents with increasingly smaller dimensions. Fin Field-Effect Transistors (FinFET) were thus developed. FinFETs include vertical semiconductor fins above a substrate. The semiconductor fins are used to form source and drain regions, and channel regions between the source and drain regions. Shallow Trench Isolation (STI) regions are formed to define the semiconductor fins. The FinFETs also include gate stacks, which are formed on the sidewalls and the top surfaces of the semiconductor fins. Since FinFETs have a three-dimensional channel structure, ion implantation processes to the channel require extra care to reduce any geometrical effects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B illustrate one of the various stages of a semiconductor device fabrication process in accordance with an embodiment of the present disclosure.

FIGS. 6A and 6B illustrate one of the various stages of a semiconductor device fabrication process in accordance with an embodiment of the present disclosure.

FIGS. 8A and 8B illustrate one of the various stages of a semiconductor device fabrication process in accordance with an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed.

Disclosed embodiments relate to a semiconductor device, in particular, a field effect transistor (FET) and its manufacturing method. The embodiments such as those disclosed herein are generally applicable not only to FinFETs but also to double-gate, surround-gate, omega-gate or gate-all-around (GAA) transistors, and/or nanowire transistors, or any suitable device having a three-dimensional channel structure.

FIGS. 1-8B and 12A-12B illustrate various stages of a semiconductor device fabrication process in accordance with an embodiment of the present disclosure. It is understood that additional operations can be provided before, during, and after processes shown by FIGS. 1-8B and 12A-12B, and some of the operations described below can be replaced or eliminated, for additional embodiments of the method. The order of the operations/processes may be interchangeable.

Figure 1:
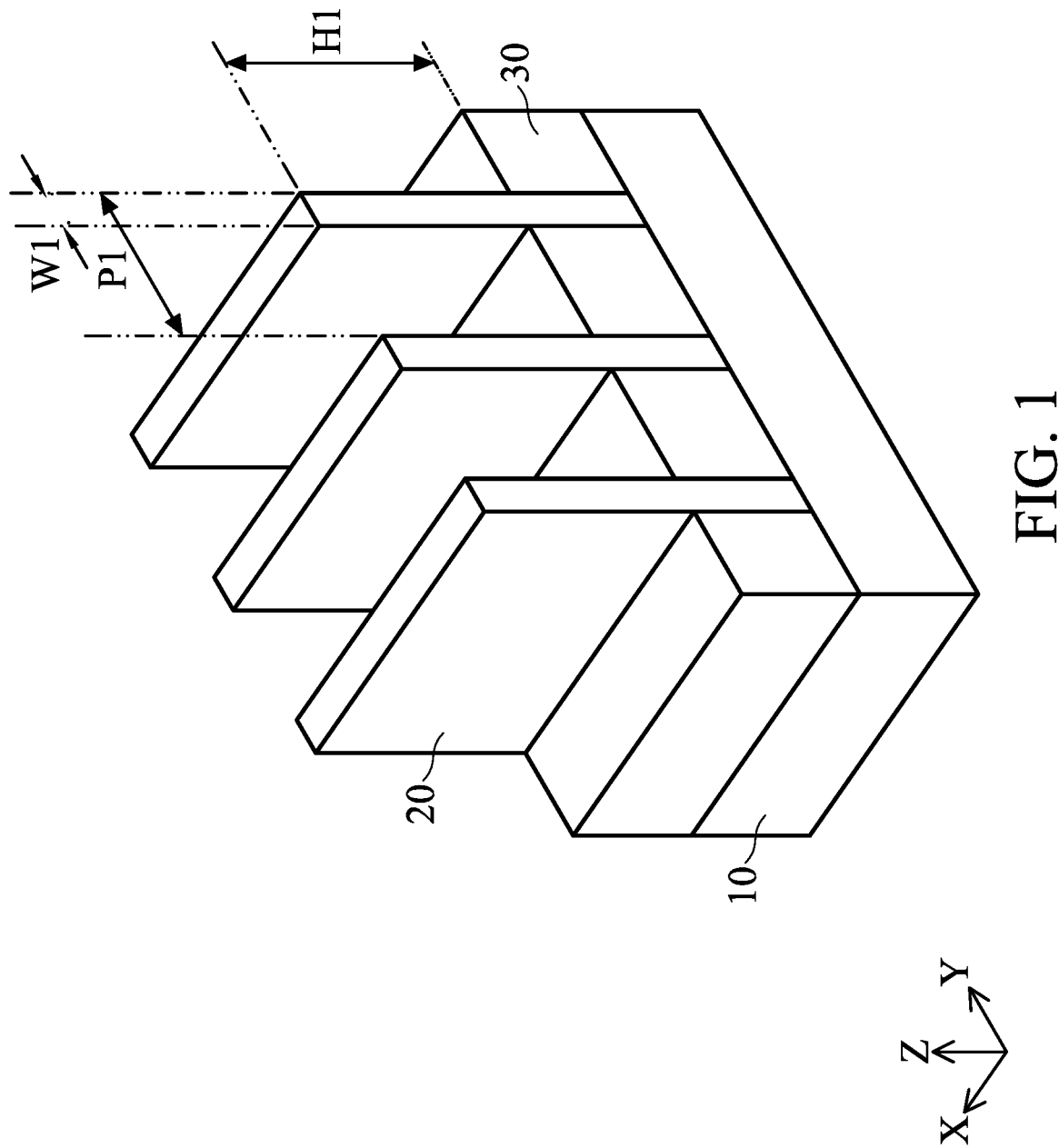
FIG. 1 illustrates one of the various stages of a semiconductor device fabrication process in accordance with an embodiment of the present disclosure.

First, as shown in FIG. 1, fin structures 20 are formed over a substrate 10 using, for example, a patterning process. The substrate 10 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 10 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 10 may include an epitaxial layer (epi-layer), which may be strained for performance enhancement, and/or may include a silicon-on-insulator (SOI) structure.

The fin structures 20 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures. In FIG. 1, three fin structures 20 are illustrated. However, the numbers of the fin structures is not limited to three. In some embodiments, one or more dummy fin structures are formed adjacent to the fin structure 20 of an active FinFET.

After the fin structures are formed, an isolation insulating layer 30 (e.g., shallow trench isolation (STI)), is disposed over the fin structures 20 and the substrate 10. Prior to forming the isolation insulating region 30, one or more liner layers are formed over the substrate 10 and sidewalls of the bottom part of the fin structures 20, in some embodiments. In some embodiments, the liner layers include a first fin liner layer formed on the substrate 10 and sidewalls of the bottom part of the fin structures 20, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

The isolation insulating layer 30 includes one or more layers of insulating materials, for example, silicon dioxide, silicon oxynitride and/or silicon nitride formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 30 may be formed by one or more layers of SOG, SiO, SiON, SiOCN or fluorine-doped silicate glass (FSG) in some embodiments.

After forming the isolation insulating layer 30 over the fin structures 20, a planarization operation is performed so as to remove part of the isolation insulating layer 30 and a mask layer (e.g., a pad oxide layer and a silicon nitride mask layer) which is used to pattern the fin structures. The planarization operation may include a chemical mechanical polishing (CMP) and/or an etch-back process. Subsequently, portions of the isolation insulating layer 30 extending over the top surfaces of the fin structures 20, and portions of the liner layers over the top surfaces of the fin structures 20 are removed using, for example, an etch process, chemical mechanical polishing (CMP), or the like. Further, the isolation insulating layer 30 is recessed to expose the upper portion of the fin structures 20. In some embodiments, the isolation insulating layer 30 is recessed using a single etch processes, or multiple etch processes. In some embodiments in which the isolation insulating layer 30 is made of silicon oxide, the etch process may be, for example, a dry etch, a chemical etch, or a wet cleaning process. In certain embodiments, the partially removing the isolation insulating layer 30 may be performed using a wet etching process, for example, by dipping the substrate in hydrofluoric acid (HF). In another embodiment, the partially removing the isolation insulating layer 30 may be performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

As shown in FIG. 1, the fin structures 20 extend in the X direction and are arranged in the Y direction with an equal pitch P1. The width W1 of the fin structure 20 at this stage is in a range of about 5 nm to about 40 nm in some embodiments. In certain embodiments, the width W1 of the fin structure 20 is in a range of about 7 nm to about 15 nm. The height H1 of the fin structure 20 measured from the upper surface of the isolation insulating layer 30 at this stage is in a range of about 50 nm to about 300 nm in some embodiments. In certain embodiments, the height H1 of the fin structure 20 is in a range of about 50 nm to about 100 nm. The pitch P1 of the fin structures 20 is in a range of about 10 nm to about 90 nm in some embodiments. In certain embodiments, the width of the fin structure 20 is in a range of about 14 nm to about 45 nm. The space between the fin structures 20 is in a range of about 5 nm to about 80 nm in some embodiments, and may be in a range of about 7 nm to about 15 nm in other embodiments.

Figure 2A:
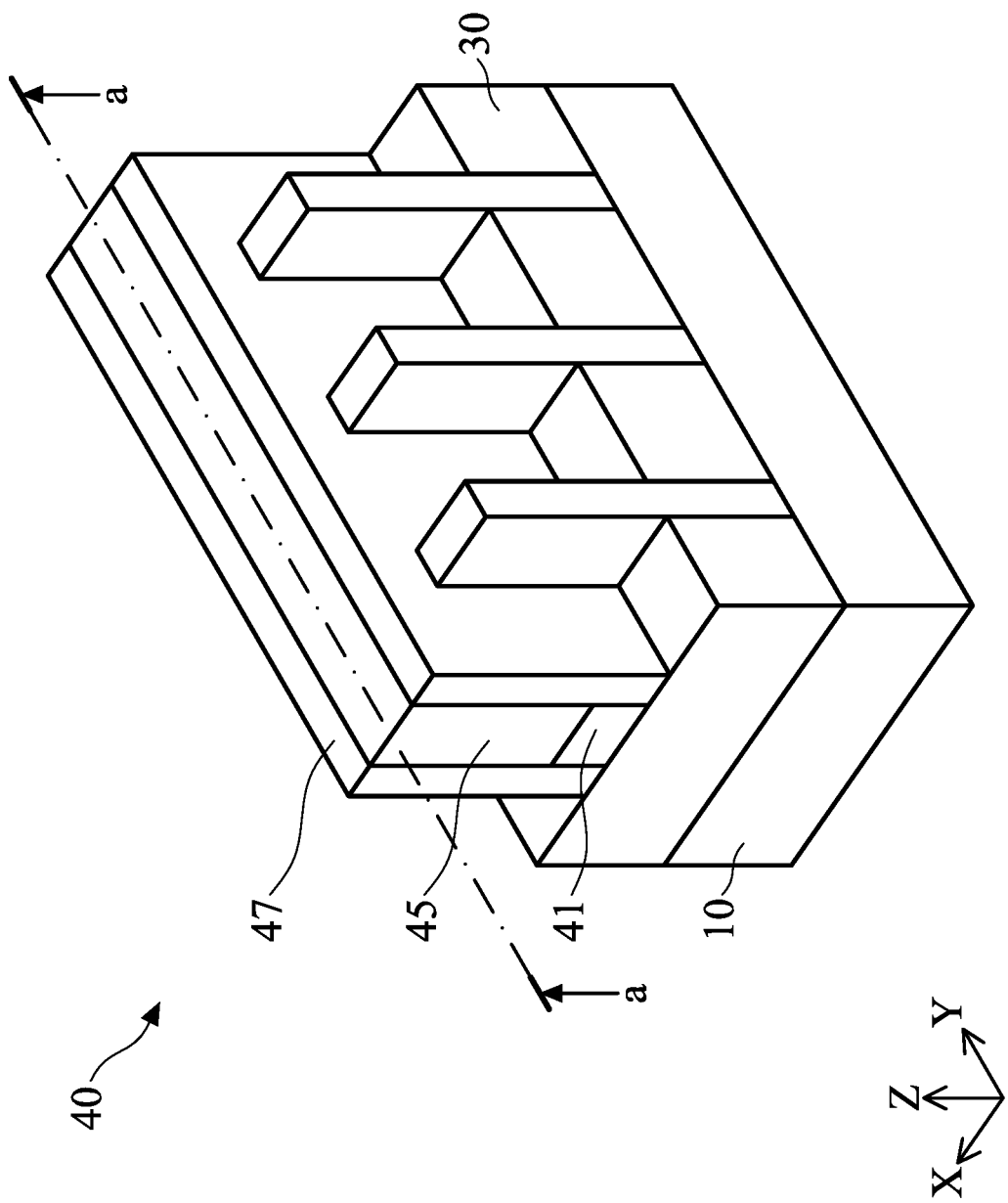
FIGS. 2A and 2B illustrate one of the various stages of a semiconductor device fabrication process in accordance with an embodiment of the present disclosure.
Figure 2B:
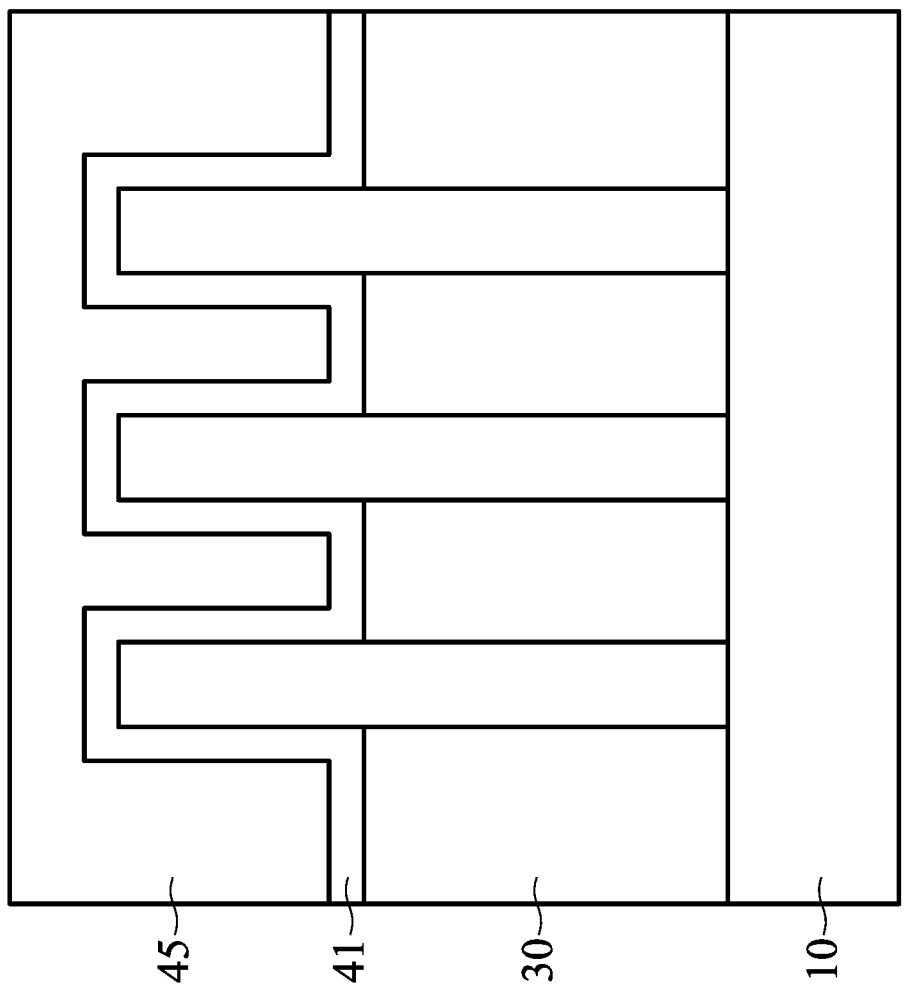

After the fin structures 20 and the isolation insulating layer 30 are formed, a dummy gate structure 40 including a dummy gate dielectric layer 41 and a dummy gate electrode layer 45 are formed over the exposed fin structures 120, which are subsequently used as channel layers, as shown in FIGS. 2A and 2B. FIG. 2A is a perspective view and FIG. 2B is a cross sectional view corresponding to line a-a of FIG. 2A along the Y direction.

The dummy gate dielectric layer 41 and the dummy gate electrode layer 45 will be subsequently used to define and form the source/drain regions. In some embodiments, the dummy gate dielectric layer 41 and the dummy gate electrode layer 45 are formed by depositing and patterning a dummy dielectric layer formed over the exposed fin structures 20 and a dummy electrode layer over the dummy gate dielectric layer. The dummy dielectric layer 41 may be formed by thermal oxidation, CVD, sputtering, or any other methods known and used in the art for forming a dummy dielectric layer. In some embodiments, the dummy dielectric layer 41 may be made of one or more suitable dielectric materials such as silicon oxide, silicon nitride, SiCN, SiON, and SiN, low-k dielectrics such as carbon doped oxides, extremely low-k dielectrics such as porous carbon doped silicon dioxide, a polymer such as polyimide, the like, or a combination thereof. In one embodiment, $SiO_2$ is used.

Subsequently, the dummy gate electrode layer 45 is formed over the dummy gate dielectric layer. In some embodiments, the dummy gate electrode layer is a conductive material and is selected from a group comprising amorphous silicon, poly silicon, amorphous germanium, poly germanium, amorphous silicon-germanium, poly silicon-germanium, metallic nitrides, metallic silicides, metallic oxides, and metals. The dummy electrode layer may be deposited by PVD, CVD, sputter deposition, or other techniques known and used in the art for depositing conductive materials. Other materials, conductive and non-conductive, may be used. In one embodiment, polysilicon is used.

A mask pattern may be formed over the dummy gate electrode layer 45 to aid in the patterning. The mask pattern includes a first mask layer and a second mask layer disposed on the first mask layer. The mask pattern includes one or more layers of $SiO_2$, SiCN, SiON, aluminum oxide, silicon nitride, or other suitable materials. In some embodiments, the first mask layer includes silicon nitride or SiON and the second mask layer includes silicon oxide. By using the mask pattern as an etching mask, the dummy electrode layer is patterned into the dummy gate electrode 45. In some embodiments, the dummy dielectric layer is also patterned to define the dummy gate dielectric layer. The fin structures 20 extend in the X direction and the dummy gate structure 40 extends in the Y direction substantially perpendicular to the X direction. In FIGS. 2A and 2B, one dummy gate structure is illustrated. However, the number of the dummy gate structures is not limited to one.

Further, sidewall spacers 47 are formed on opposing sidewalls of the dummy gate structure 40, as shown in FIG. 2A. The sidewall spacers 47 include one or more dielectric layers. In one embodiment, the sidewall spacers 47 are made of one or more of silicon oxide, silicon nitride, SiOCN, SiCN, aluminum oxide, AlCO or AlCN, or any other suitable dielectric material. A blanket layer of a side-wall insulating material may be formed by CVD, PVD, ALD, or other suitable technique. Then, an anisotropic etching is performed on the side-wall insulating material to form a pair of side-wall insulating layers (spacers) 47 on two main sides of the gate structure. The thickness of the side-wall insulating layers 47 is in a range of about 5 nm to about 30 nm in some embodiments, and in a range of about 10 nm to about 20 nm in other embodiments.

Figure 3:
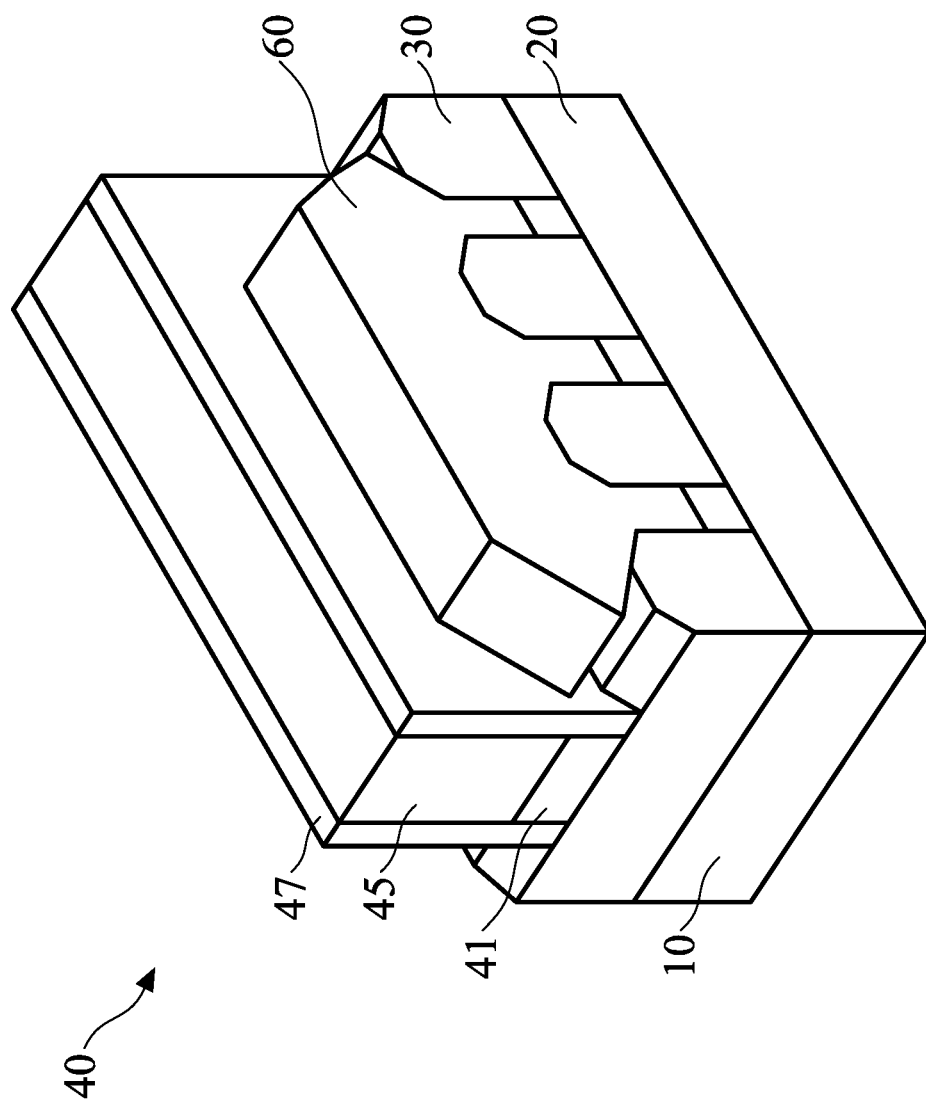
FIG. 3 illustrates one of the various stages of a semiconductor device fabrication process in accordance with an embodiment of the present disclosure.

Subsequently, source/drain regions of the fin structures 20 are recessed down below the upper surface of the isolation insulating layer 30. Then, a source/drain epitaxial layer 60 is formed over the recessed source/drain regions of the fin structures 20, as shown in FIG. 3. In some embodiments, the source/drain epitaxial layer 60 is a merged epitaxial layer as shown in FIG. 3. In other embodiments, the source/drain epitaxial layer 60 is individually formed over the recessed fin structures 20 without merging the adjacent source/drain epitaxial layer.

The materials used for the source/drain epitaxial layer 60 may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. In some embodiments, boron (B) is doped in the source/drain epitaxial layer for the p-type FinFETs. Other materials can be used. In some embodiments, the source/drain epitaxial layer 60 includes two or more epitaxial layers with different compositions and/or different dopant concentrations. The source/drain epitaxial layer 60 can be formed by CVD, ALD, molecular beam epitaxy (MBE), or any other suitable methods.

After the source/drain epitaxial layer 60 is formed, an interlayer dielectric (ILD) layer 50 is formed. In some embodiments, before forming the ILD layer, an etch stop layer (ESL) is formed over the source/drain epitaxial layer 60 and sidewall spacers 47. The ESL is made of silicon nitride or a silicon nitride-based material (e.g., SiON, SiCN or SiOCN). The materials for the ILD layer 50 include compounds comprising Si, 0, C and/or H, such as silicon oxide, SiCOH and SiOC. Organic materials, such as polymers, may be used for the ILD layer 50.

After the ILD layer 50 is formed, a planarization operation, such as an etch-back process and/or a chemical mechanical polishing (CMP) process, is performed to expose the upper surface of the dummy gate electrode layer 45, as shown in FIGS. 4A and 4B. FIG. 4A is a cross sectional view along the X direction, and FIG. 4B is a cross sectional view along the Y direction. In FIGS. 4-8 and 11, only two fin structures 20 are illustrated for simplicity.

Figure 5A:
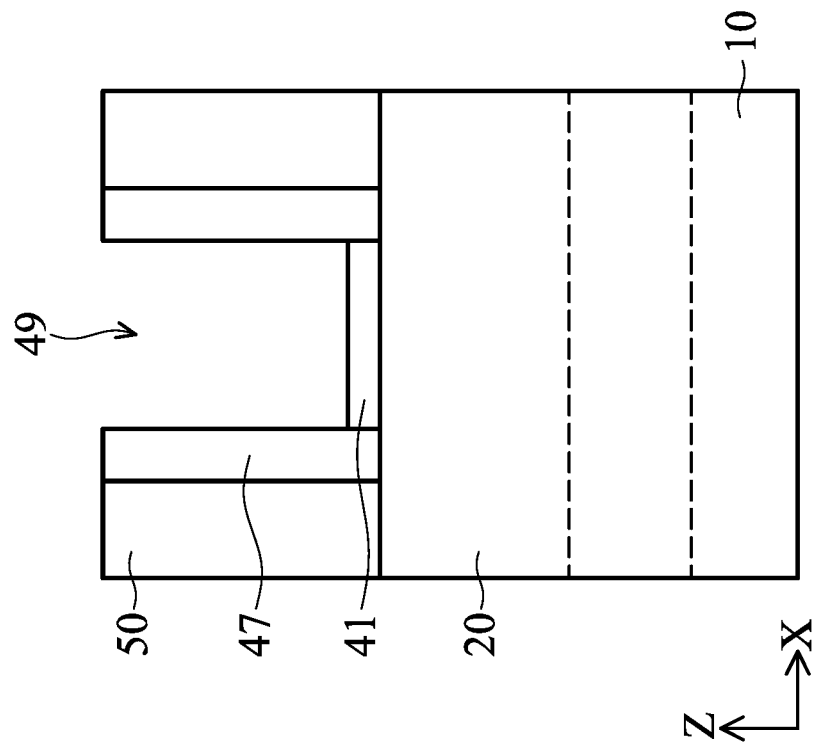
FIGS. 5A and 5B illustrate one of the various stages of a semiconductor device fabrication process in accordance with an embodiment of the present disclosure.
Figure 5B:
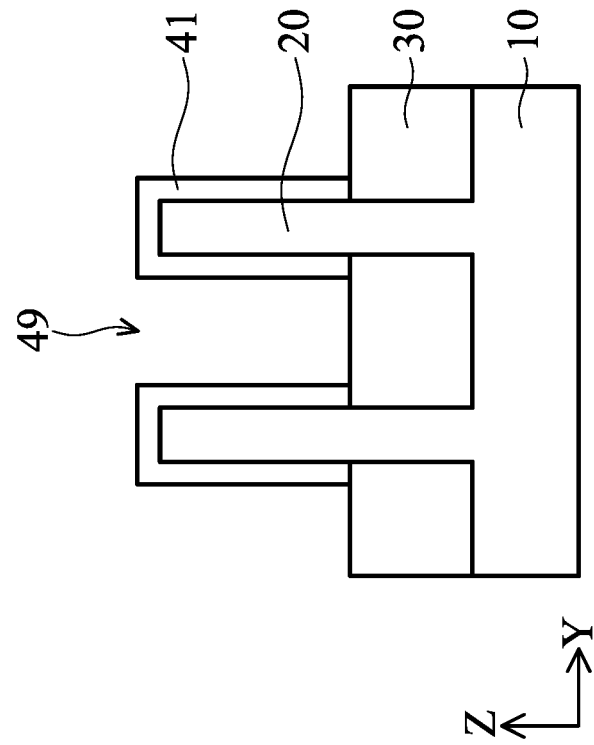

Then, as shown in FIGS. 5A and 5B, the dummy gate electrode layer 45 is removed, thereby forming a gate space 49. When the dummy gate electrode layer 45 is polysilicon and the ILD layer 50 is silicon oxide, a wet etchant such as a tetramethylammonium hydroxide (TMAH) solution can be used to selectively remove the dummy gate electrode layer. Further, the dummy gate dielectric layer 41 is thereafter removed using plasma dry etching and/or wet etching, thereby exposing the upper portion of the fin structures 20, as shown in FIGS. 6A and 6B.

Figure 7A:
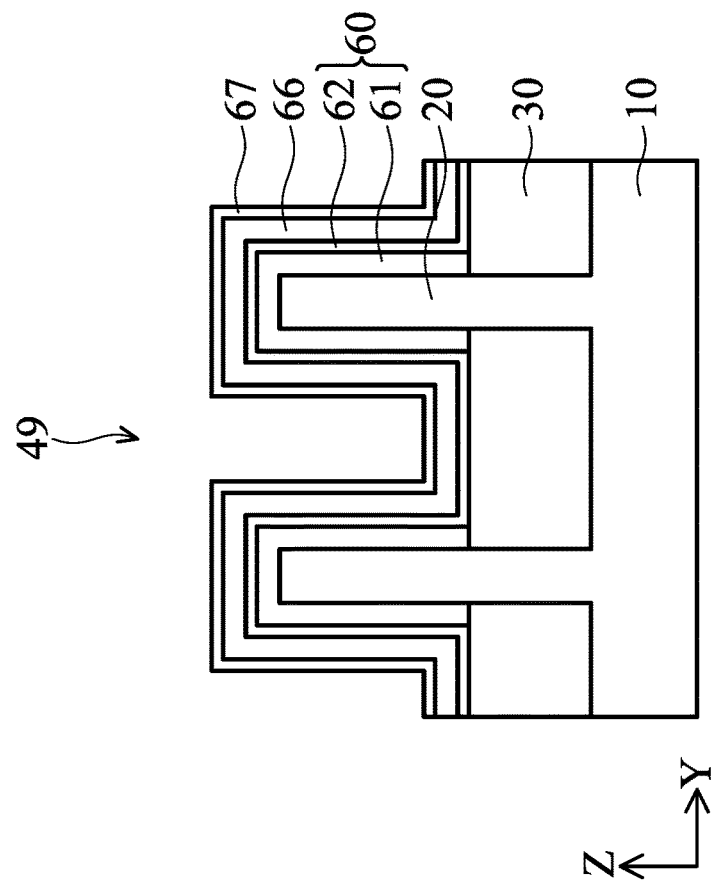
FIGS. 7A and 7B illustrate one of the various stages of a semiconductor device fabrication process in accordance with an embodiment of the present disclosure.
Figure 7B:
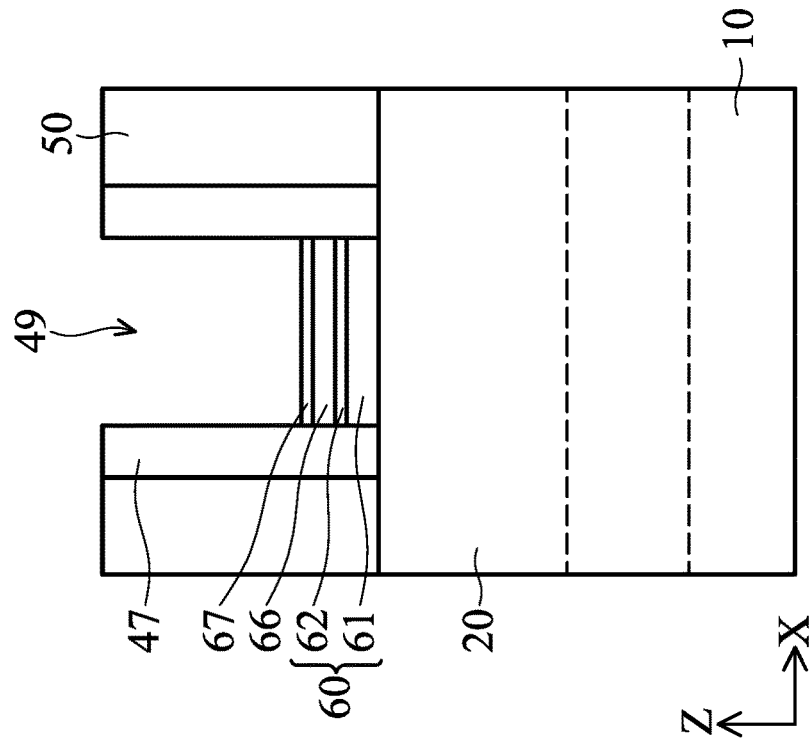

After the upper portion of the fin structures 20 are exposed, in the gate space 49, a gate dielectric layer 60 including an interfacial layer 61 and a high-k gate dielectric layer 62 are formed on the exposed fin structures (channel layers) 20 as shown in FIGS. 7A and 7B. The interfacial layer 61 is a chemically formed silicon oxide in some embodiments. The chemical silicon oxide may be formed using deionized water+ozone (DIO$_3$), NH$_4$OH+H$_2$O$_2$+H$_2$O (APM), or other methods. The high-k gate dielectric layer 62 includes one or more layers of HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials. The gate dielectric layer 60 may be formed by CVD, ALD or any suitable method. In one embodiment, the gate dielectric layer 60 is formed using a highly conformal deposition process such as ALD in order to ensure the formation of a gate dielectric layer having a uniform thickness around each channel layers. The thickness of the gate dielectric layer 60 is in a range from about 1 nm to about 6 nm in one embodiment.

In addition, a conductive layer as a barrier layer 66 is formed over the gate dielectric layer 60. The barrier layer 66 includes one or more layers of TaN, TiN, TiN doped with Si, or any other suitable conductive material. After the barrier layer 66 is formed, an anneal operation (e.g., at a temperature about 700-900° C.) is performed in some embodiments. The thickness of the barrier layer 66 is in a range from about 0.5 nm to about 5 nm in some embodiments.

In some embodiments, a cap layer 67 is further formed on the barrier layer 66 as shown in FIGS. 7A and 7B. The cap layer 67 is made of amorphous material, such as amorphous Si, amorphous Ge, or any other suitable material, in some embodiments. The thickness of the cap layer 67 is in a range from about 0.5 nm to about 5 nm in some embodiments.

After the cap layer 67 is formed, an ion implantation operation is performed to introduce dopants into the channel layer to improve electrical properties of the FinFETs. In certain embodiments, fluorine (F) is used as a dopant. In the present disclosure, multiple angle ion implantation operations 100 are performed. The implanted fluorine can reduce defects existing in the interface between the channel (e.g., Si) and the interfacial layer (e.g., oxide).

Ion implantation operations to a high-aspect ratio structure, such as fin structures face some problems such as a shadowing effect. Due to the shadowing effect, ions may not implant into the fin structures uniformly. In the present disclosure, to solve this problem, a multiple angle implantation process is employed. By using smaller tilt angles with respect to the normal direction perpendicular to the surface of the substrate (Z direction), it is possible to implant ions into the top and valley portions of the fin structures, while by using larger tilt angles with respect to the normal direction, it is possible to implant ions into side faces of the fin structures.

Figure 9:
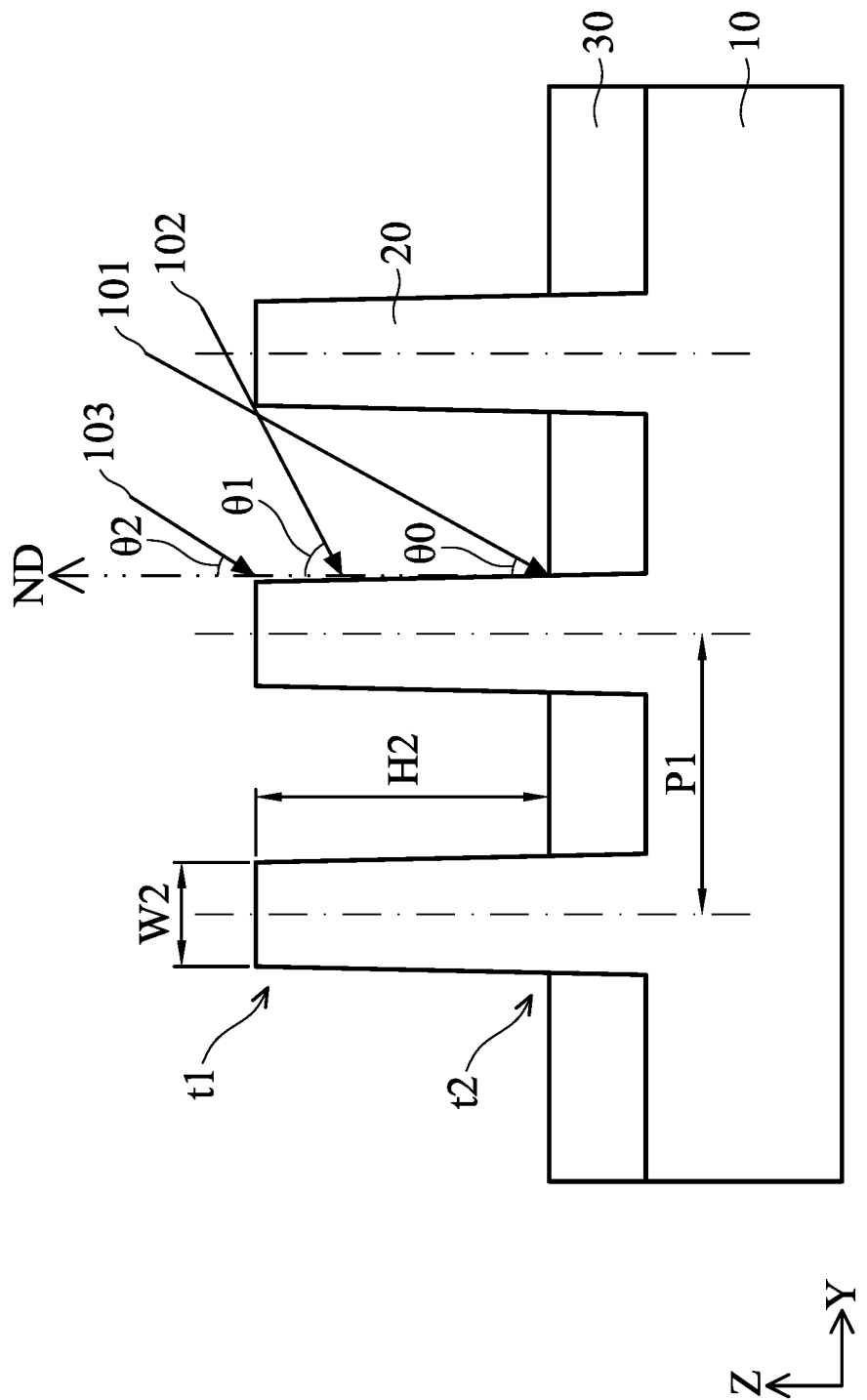
FIG. 9 illustrates a multiple angle ion implantation process in accordance with an embodiment of the present disclosure.

FIG. 9 shows a conceptual figure illustrating multiple angle ion implantations. In the multiple angle ion implantation, one of the implantation operations (main implantation) is performed with an angle $\theta_0$ with respect to the normal direction ND, where $\theta_0=\tan^{-1}((P1-W2)/H2)\times 180/\pi$ (degree). P1 is a pitch of the fin structures 20, W2 is a width of the fin structures 20 at this stage of the manufacturing process, and H2 is a height of the fin structures 20 above the isolation insulating layer 30 at this stage of the manufacturing process. The dimension P1-W2 means the space between adjacent fin structures. The width W2 and the height H2 of the fin structures 20 include the thicknesses of the gate dielectric layer 60, the barrier layer 66 and the cap layer 67, and the height H2 of the fin structures 20 is measured from the upper surface of the cap insulating layer 67, as shown in FIGS. 8A and 8B. In FIG. 9, the gate dielectric layer 60, the barrier layer 66 and the cap layer 67 are not shown for simplicity. In other embodiments, the width W2 and height H2 can be defined without considering the gate dielectric layer 60, the barrier layer 66 and the cap layer 67.

The angle $\theta$ of the tilted ion implantation is defined as an acute angle (smaller angle) made by the normal direction ND (the Z direction) of a main surface of the substrate and an ion beam direction in the ZY plane made by the Z direction and the Y direction. If the angle is zero, the direction of the ion beam is substantially parallel to the normal direction of the substrate.

The main ion implantation 101 at the angel $\theta_0$ is performed twice to implant ions into one of the side surface of the fin structures 20 (e.g., the right side in FIG. 9) and the other side surface of the fin structure 20 (e.g., the left side in FIG. 9), for example, by rotating the substrate (wafer) 180 degrees around its center axis. In other embodiments, the two main ion implantations are performed at the angle $+\theta_0$ and $-\theta_0$, without rotating the wafer. Thus, multiple tilted angle ion implantations are performed on one side surface of the fin structure. In some embodiments, $\theta_0$ is not necessarily calculated from the aforementioned equation, and is set in a range from 5 degrees to 10 degrees.

When the fin structures extend in only one direction (e.g., X direction), no tilt angle implantations with 90 and 270 wafer rotations are performed. When the fin structures extend in two directions (e.g., X and Y direction), tilt angle implantations with 90 and 270 wafer rotations may be performed.

As shown in FIG. 9, a first additional ion implantation 102 is performed with tilt angles of $\theta_1=\theta_0+\alpha$, where $\alpha$ in in a range from 1.5 degrees to 3.0 degrees. In some embodiments, $\alpha=2$ degrees. Similar to the main ion implantation, the first ion implantation at the angel $\theta_1$ is performed twice by rotating the substrate (wafer) with 180 degrees. In other embodiments, the two first additional ion implantations are performed at the angle $+\theta_1$ and $-\theta_1$.

Further, in some embodiments, a second additional ion implantation 103 is performed with tilt angles of $\theta_2=\theta_0-\alpha$, where $\alpha$ in in a range from 1.5 degrees to 3.0 degrees. In some embodiments, $\alpha=2$ degrees. Similar to the main ion implantation, the second ion implantation at the angel $\theta_2$ is performed twice by rotating the substrate (wafer) 180 degrees. In other embodiments, the two second additional ion implantations are performed at the angle $+\theta_2$ and $-\theta_2$.

In some embodiments, in addition to the implantation with tilt angles of $\theta_0\pm\alpha$, ion implantation operation with tilt angles of $\theta_4=\theta_0+2a$ and $\theta_5=\theta_0-2\alpha$ are performed. In certain embodiments, ion implantation operations with tilt angles of $\theta_6=\theta_0+3\alpha$ and $\theta_5=\theta_7-3\alpha$ are performed. The angles can be changed by tilting a stage on which the substrate (wafer) is placed with respect to the ion bean direction. In some embodiments, one of the tilt angles is zero.

FIGS. 10A-10D show one of the effects of the multiple angle ion implantation process according to the present embodiments. In the tilt angle implantation 201 shown in FIG. 10A, the tilt angle is set to $\theta_{11}$ ($\pm\theta_{11}$) which is the smallest tilt angle in the multiple angle ion implantation. By this implantation, the ions can be implanted into most or all of the side surfaces and the upper region of the fin structures 20. The dimension L11 is a length of the side surface area into which the ions are implanted, the dimension W11 is a depth of the implanted region of the side surface area, and the dimension Ti 1 is a depth of the implanted region at the top of the fin structure 20.

Figure 10B:
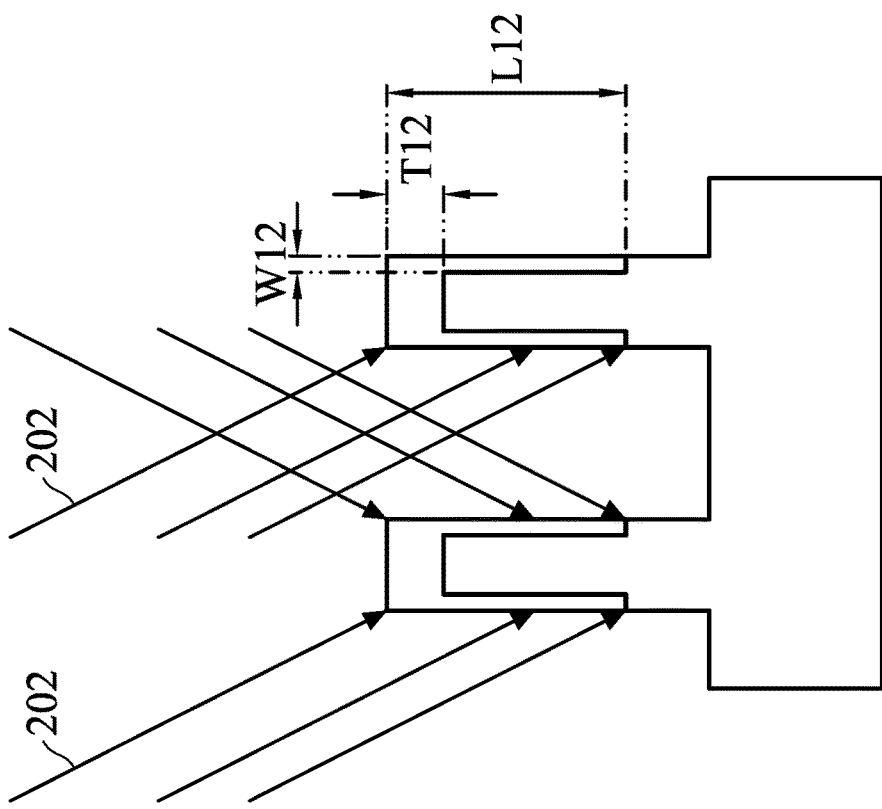
FIGS. 10A, 10B, 10C and 10D illustrate multiple angle ion implantation processes in accordance with an embodiment of the present disclosure.
Figure 10A:
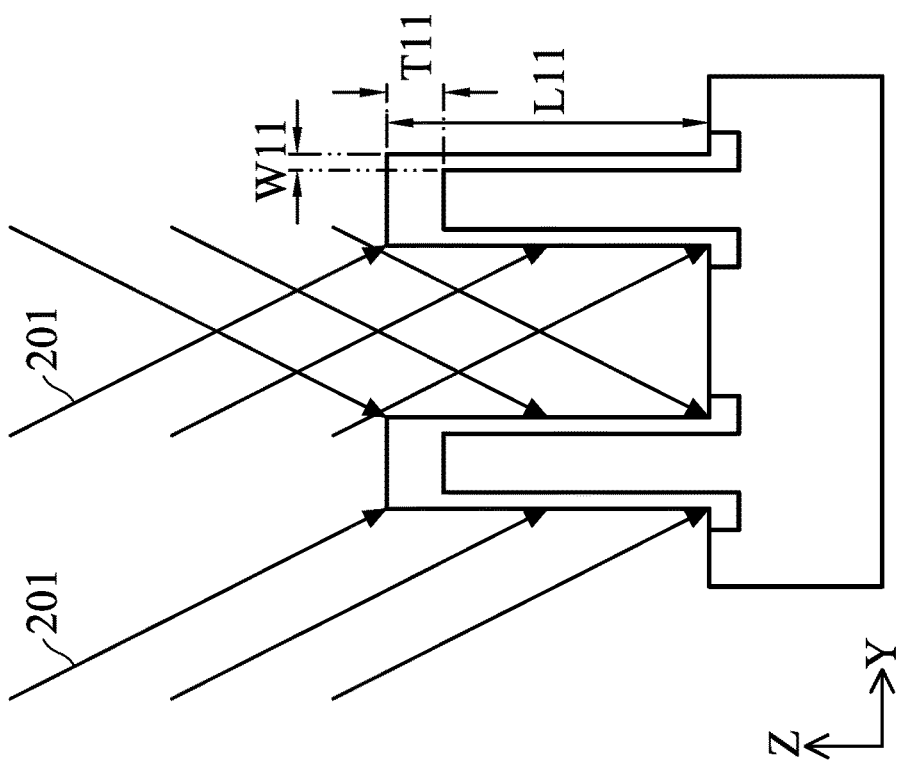

In the tilt angle implantation 202 shown in FIG. 10B, the tilt angle is set to $\theta_{12}$ ($\pm\theta_{12}$) larger than $\theta_{11}$ in the multiple angle ion implantation. By this implantation, the ions are not implanted into the bottom region of the fin structure 20 due to the shadowing effect of the fin structures. The dimension L12, which is a length of the side surface area into which the ions are implanted, is smaller than L11, the dimension W12, which is a depth of the implanted region of the side surface area, is larger than W11, and the dimension T12, which is a depth of the implanted region at the top of the fin structure, is larger than Ti 1.

Figure 10D:
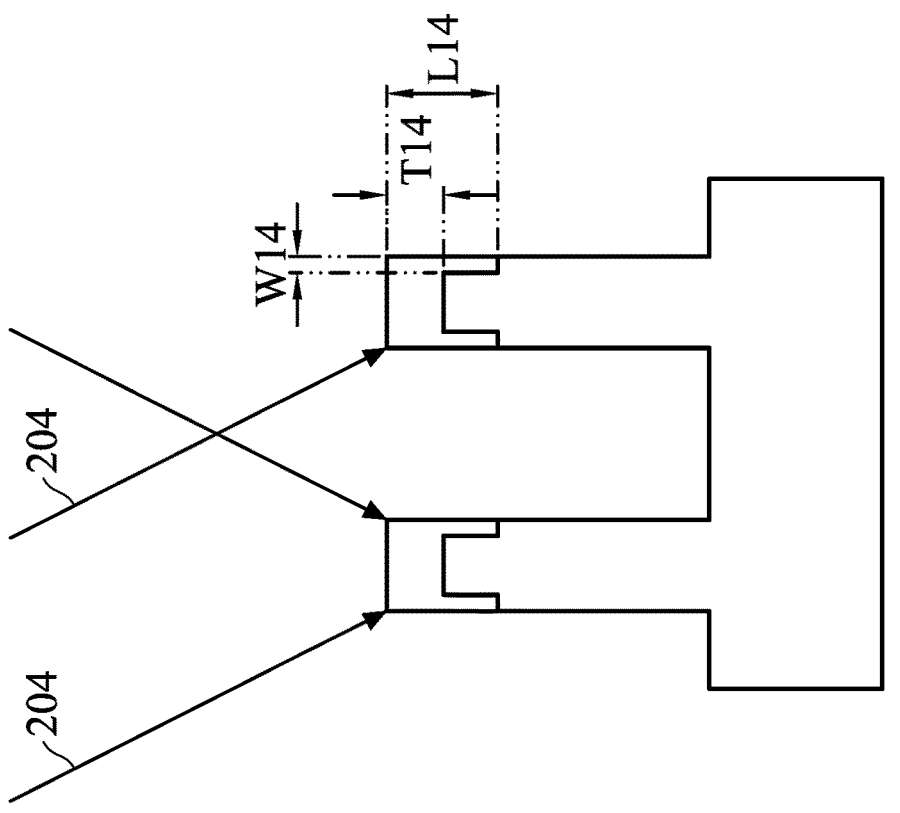
Figure 10C:
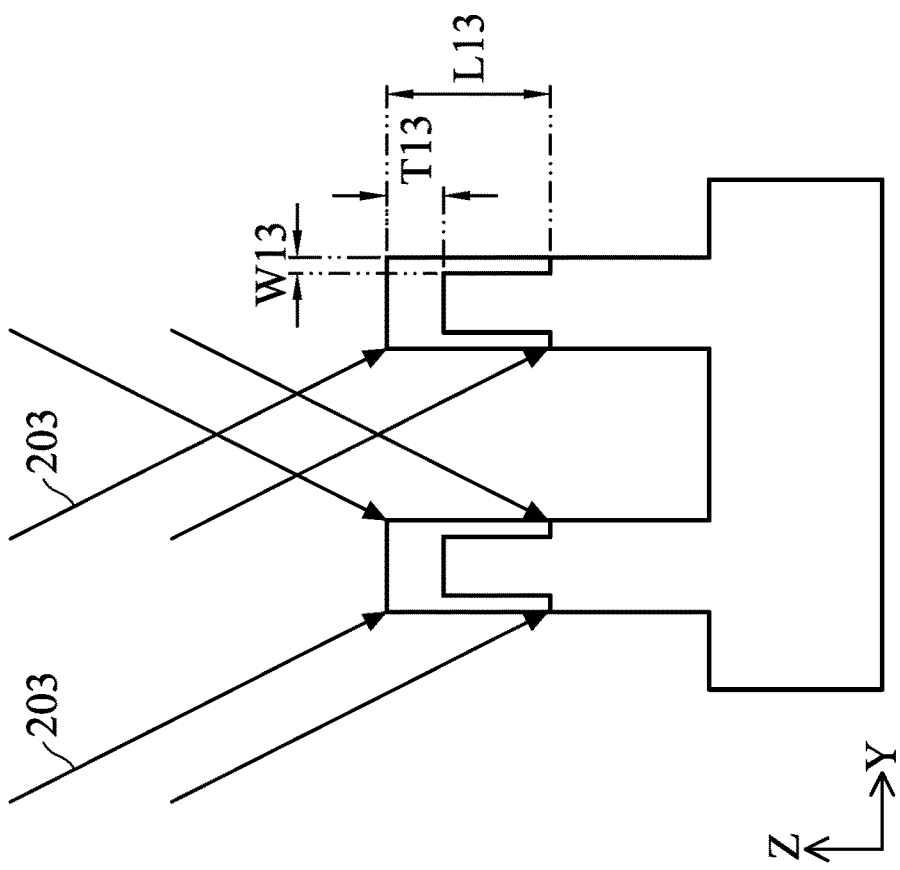

In the tilt angle implantation 203 shown in FIG. 10C, the tilt angle is set to $\theta_{13}$ ($\pm\theta_{13}$) larger than $\theta_{12}$ in the multiple angle ion implantation. By this implantation, the ions are not implanted into the bottom region of the fin structure 20 due to the shadowing effect of the fin structures. The dimension L13, which is a length of the side surface area into which the ions are implanted, is smaller than L12, the dimension W13, which is a depth of the implanted region of the side surface area, is larger than W12, and the dimension T13, which is a depth of the implanted region at the top of the fin structure, is larger than T12.

Further, in the tilt angle implantation 204 shown in FIG. 10D, the tilt angle is set to $\theta_{14}$ ($\pm\theta_{14}$) larger than $\theta_{13}$, which may be the largest tilt angle, in the multiple angle ion implantation. By this implantation, the ions are not implanted into the bottom and middle regions of the fin structure 20 due to the shadowing effect of the fin structures. The dimension L14, which is a length of the side surface area into which the ions are implanted, is smaller than L13, the dimension W14, which is a depth of the implanted region of the side surface area, is larger than W13, and the dimension T14, which is a depth of the implanted region at the top of the fin structure, is larger than T13.

As shown in FIGS. 10A-10D, when the tilt angle is smaller, the dose amount to the top region of the fin structure is larger than the dose amount to the side surface region of the fin structure. In contrast, when the tilt angle becomes larger, the dose amount to the top region of the fin structure decreases and the dose amount to the side surface region of the fin structure increases. By combining two or more tilt angles, it is possible to more uniformly introduce the dopant into the top, bottom and the side surfaces of the fin structures.

The dose amounts required (i.e., the total dose amount) may be divided by each ion implantation. In some embodiments, the dose amount is equally divided for each implantation. In other embodiments, different dose amounts are set for each of the multiple ion implantations. The dose amounts for ion implantations for 0 and 180 degree wafer rotations (tilt angle ($\pm 0$)) are the same at a given tilt angle. For example, as shown in FIGS. 10A-10D, four tilt angles are used, the dose amount in each ion implantation at a given angle is about 25% of the total dose amount. In some embodiments, the dose amount is set smaller as the tilt angle becomes larger. In other embodiments, the dose amount is set larger as the tilt angle becomes larger.

In some embodiments, the fluorine ions are implanted at acceleration energy in a range from about 250 eV to about 350 eV. The total dose amount of fluorine is in a range from about $1 \times 10^{14}$ cm$^{-2}$ to $2 \times 10^{15}$ cm$^{-2}$ in some embodiments, and is in a range from about $5 \times 10^{14}$ cm$^{-2}$ to $1 \times 10^{15}$ cm$^{-2}$ in other embodiments.

In FIGS. 10A-10D, four tilt angles (eight tilt angle implantation operations for the left side surface and the right side surfaces) are utilized. However, the number of tilt angles is not limited to four. It can be as small as two, and can be more than four and up to ten in some embodiments.

In the foregoing embodiments, the tilt angles are set discretely (e.g., $\theta_a$, $\theta_b$, $\theta_c$ . . . ). In some embodiments, the difference between the angles is about 1.5-3 degrees, for example about 2 degrees. In other embodiments, the tilt angle is gradually changed during the entire ion implantation operation from the smallest tilt angle to the largest tilt angle.

Figure 11:
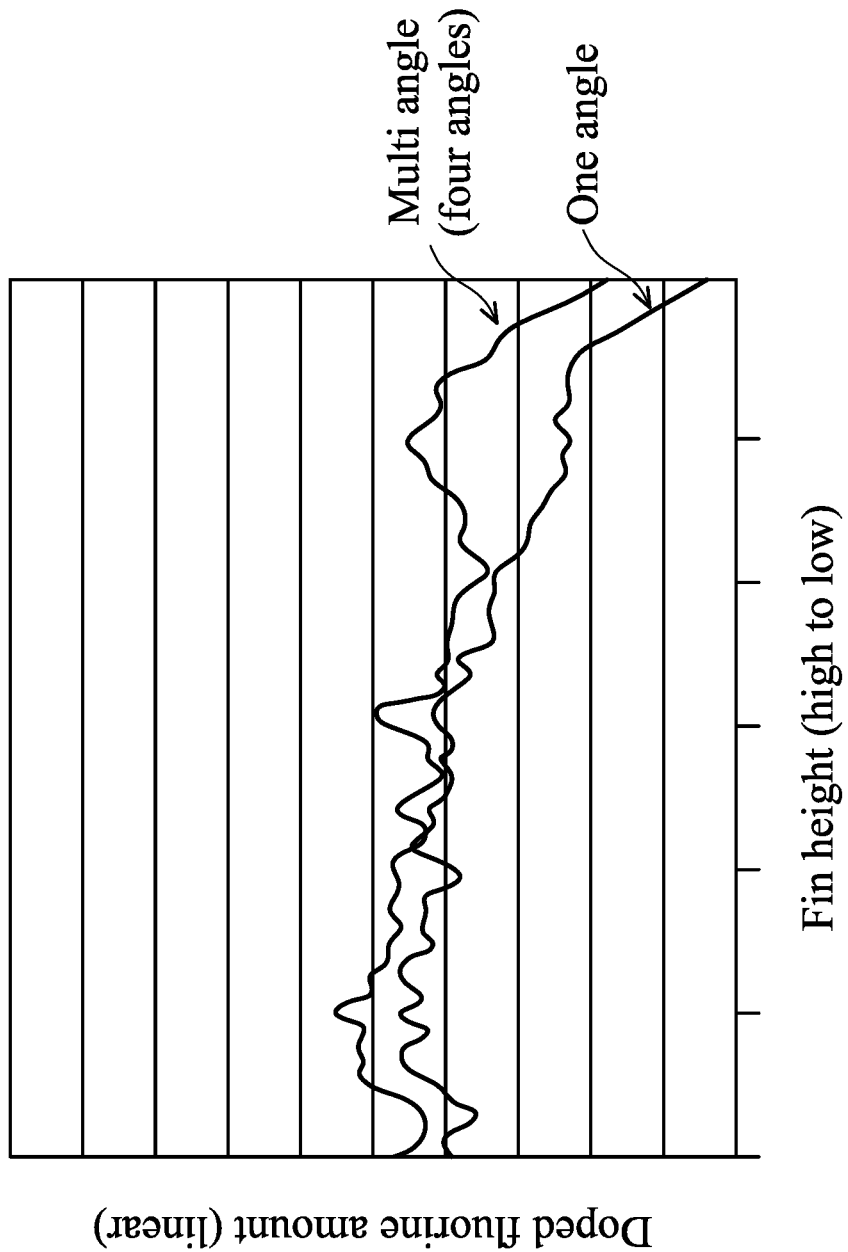
FIG. 11 shows doped fluorine amounts in the fin structure measured by secondary ion mass spectroscopy (SIMS).

FIG. 11 shows doped fluorine amount into the fin structure measured by secondary ion mass spectroscopy (SIMS). In FIG. 11, the horizontal axis shows the height of the fin structure (high to low position). As shown in FIG. 11, when the multi angle implantation is used, fluorine atoms are more uniformly implanted compared with the single angle implantation. The uniformity ((highest value-lowest value)/lowest value) is about 21.5% for the multi angle implantation, while the uniformity is about 29% for the single angle implantation. By adjusting the number of tilt angle implantations, the angles and/or the dose amount for each implantation, it is possible to obtain a uniformity about 20-25%.

Figure 12B:
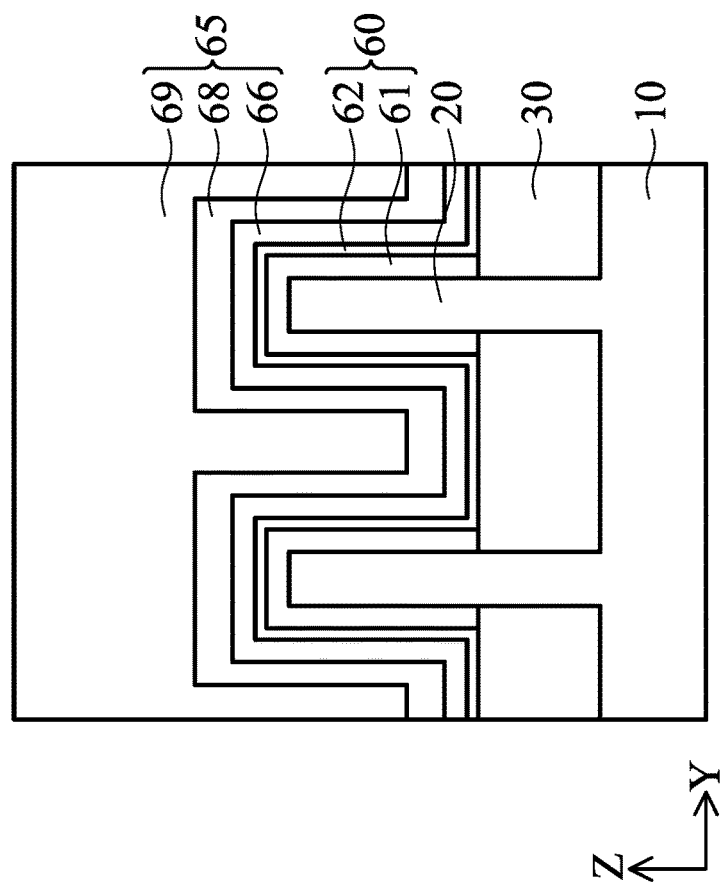
FIGS. 12A and 12B illustrate one of the various stages of a semiconductor device fabrication process in accordance with an embodiment of the present disclosure.
Figure 12A:
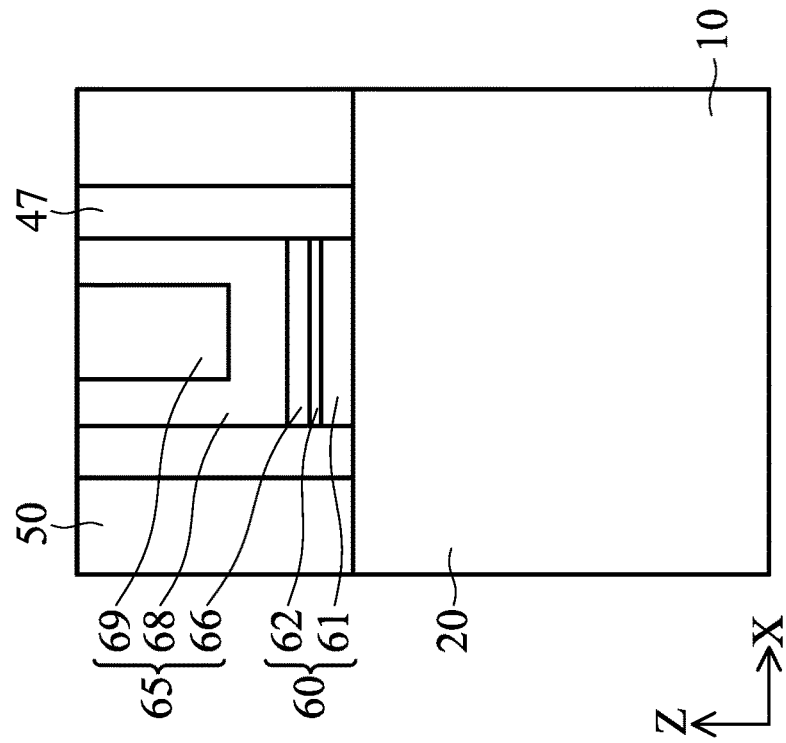

FIGS. 12A and 12B illustrate one of the various stages of a semiconductor device fabrication process in accordance with an embodiment of the present disclosure.

After the multiple ion implantations are performed, the cap layer 67 is removed. Then, one or more conductive layers are formed over the barrier layer 66, thereby forming a metal gate electrode 65.

In some embodiments, one or more work function adjustment layers 68 is formed over the barrier layer 66 and a main metal layer 69 is formed over the work function adjustment layer 68. The work function adjustment layer 68 is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

In some embodiments, the main metal layer 69 includes a metallic material selected from the group consisting of W, Cu, Ti, Ag, Al, TiAl, TiAlN, TaC, TaCN, TaSiN, Mn, Co, Pd, Ni, Re, Ir, Ru, Pt, and Zr. In some embodiments, the main metal layer 69 includes a metal selected from a group consisting of TiN, WN, TaN, and Ru. Metal alloys such as Ti—Al, Ru—Ta, Ru—Zr, Pt—Ti, Co—Ni and Ni—Ta may be used and/or metal nitrides such as WN$_x$, TiN$_x$, MoN$_x$, TaN$_x$, and TaSi$_x$N$_y$ may be used. The work function adjustment layer and the main metal layer may be formed using a suitable process such as atomic layer deposition (ALD), chemical vapor deposition (CVD), physical vapor deposition (PVD), plating, or combinations thereof.

After forming the gate electrode 65, further CMOS processes are performed to form various features such as additional interlayer dielectric layers, contacts/vias, interconnect metal layers, and passivation layers, etc. The foregoing multi angle ion implantation operations can be applied to both n-type FinFETs and p-type FinFETs.

By using the foregoing manufacturing operations, a ring oscillator with three CMOS invertors was manufactured. The electrical performance of the ring oscillator manufactured with the multi angle ion implantation exhibited about 3%-improvement compared with a ring oscillator manufactured by a single angle ion implantation.

Further, the multi angle implantation can be applied to one or more manufacturing stages to implant dopant into the fin structures. For example, a multi angle ion implantation can be performed on the fin structures after the fin structure is formed as shown in FIG. 1. In such a case, the dopant can be at least one selected from the group consisting of P, As and BF$_2$.

It will be understood that not all advantages have been necessarily discussed herein, no particular advantage is required for all embodiments or examples, and other embodiments or examples may offer different advantages.

In accordance with an aspect of the present disclosure, in a method for manufacturing a semiconductor device, fin structures are formed over a substrate, and an ion implantation operation is performed on the fin structures. The ion implantation operation is performed multiple times using different implantation angles to introduce ions into one side surface of each of the fin structures. In one or more of the foregoing or following embodiments, the fin structures extend in an X direction, and an angle θ of each of the different implantation angles is defined as an acute angle made by a normal direction, which is a Z direction, of a main surface of a substrate and an ion beam direction in a ZY plane made by the Z direction and a Y direction, where the Y direction is perpendicular to the Z direction and the X direction. In one or more of the foregoing or following embodiments, fluorine ions are implanted into the fin structures by the ion implantation operation. In one or more of the foregoing or following embodiments, ions of at least one element selected from the group consisting of P, As and $BF_2$ is implanted into the fin structures by the ion implantation operation. In one or more of the foregoing or following embodiments, the ion implantation operation is performed using three to six different implantation angles. In one or more of the foregoing or following embodiments, a dose amount of the ions decreases as an implantation angle increases. In one or more of the foregoing or following embodiments, a dose amount of the ions is constant for each implantation operation. In one or more of the foregoing or following embodiments, a dose amount of the ions is different between one implantation operation and another implantation operation.

In accordance with another aspect of the present disclosure, in a method of manufacturing a semiconductor device, fin structures, each having an upper portion and a lower portion, are formed. The lower portion is embedded in an isolation insulating layer disposed over a substrate and the upper portion protrudes from the isolation insulating layer. A gate dielectric layer is formed over the upper portion of each of the fin structures. A conductive layer is formed over the gate dielectric layer. A cap layer is formed over the conductive layer. An ion implantation operation is performed on the fin structures with the cap layer. The ion implantation operation is performed multiple times using different implantation angles to introduce ions into one side surface of each of the fin structures. In one or more of the foregoing or following embodiments, the fin structures extend in an X direction, and an angle θ of each of the different implantation angles is defined as an acute angle made by a normal direction, which is a Z direction, of a main surface of a substrate and an ion beam direction in a ZY plane made by the Z direction and a Y direction, where the Y direction is perpendicular to the Z direction and the X direction. In one or more of the foregoing or following embodiments, fluorine ions are implanted into the fin structures by the ion implantation operation. In one or more of the foregoing or following embodiments, the cap layer includes amorphous silicon. In one or more of the foregoing or following embodiments, the conductive layer includes TiN. In one or more of the foregoing or following embodiments, after the conductive layer is formed and before the cap layer is formed, an anneal operation is performed. In one or more of the foregoing or following embodiments, the cap layer is removed after the implantation operation.

In accordance with another aspect of the present disclosure, in a method of manufacturing a semiconductor device, a dummy gate structure is removed, thereby exposing a first fin structure and a second fin structure. Each of the first and second fin structures has an upper portion and a lower portion. The lower portion is embedded in an isolation insulating layer disposed over a substrate and the upper portion protrudes from the isolation insulating layer. The first and second fin structures extend in an X direction. A gate dielectric layer is formed over the upper portion of the fin structure of each of the first and second fin structures. A conductive layer is formed over the gate dielectric layer of each of the first and second fin structures. A cap layer is formed over the conductive layer of each of the first and second fin structures. An ion implantation operation is performed on the first and second fin structures with the cap layer. The ion implantation operation is performed multiple times with different implantation angles to introduce ions into one side surface of each of the first and second fin structures. In one or more of the foregoing or following embodiments, at least one of the ion implantation operations is performed at an angle $θ_0$ with respect to a normal direction of the substrate, where $θ_0 = \tan^{-1}(L-W/h)$, L is a pitch of the first fin structure and the second fin structure, W is a width of the first fin structure and the second fin structure, and h is a height of the first fin structure and the second fin structure from an upper surface of the isolation insulating layer. In one or more of the foregoing or following embodiments, one of the different implantation angles is an angle θ, and an ion implantation operation at the angle θ is performed twice by rotating the substrate 180 degrees. In one or more of the foregoing or following embodiments, a difference between two of the implantation angles is 1.5 degrees to 3.0 degrees. In one or more of the foregoing or following embodiments, fluorine ions are implanted into the fin structures by the ion implantation operation.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming fin structures over a substrate;

forming a dummy gate structure over the fin structures;

forming sidewall spacers on opposing sides of the dummy gate structure;

removing the dummy gate structure, thereby exposing channel regions of the fin structures; and forming a gate dielectric layer over the exposed channel regions of the fin structures:

forming a conductive layer over the gate dielectric layer;

forming a cap later over the conductive layer;

performing an ion implantation operation on the channel regions of the fin structures;

after the ion implantation operation, forming a gate electrode, wherein the ion implantation operation is performed multiple times using different implantation angles to introduce ions into one side surface of each of the channel regions of the fin structures.

2. The method of claim 1, wherein:
the fin structures extend in an X direction, and
an angle θ of each of the different implantation angles is defined as an acute angle made by a normal direction, which is a Z direction, of a main surface of a substrate and an ion beam direction in a ZY plane made by the Z direction and a Y direction, where the Y direction is perpendicular to the Z direction and the X direction.

3. The method of claim 2, wherein fluorine ions are implanted into the fin structures by the ion implantation operation.

4. The method of claim 2, wherein ions of at least one element selected from the group consisting of P, As and $BF_2$ is implanted into the fin structures by the ion implantation operation.

5. The method of claim 2, wherein the ion implantation operation is performed using three to six different implantation angles.

6. The method of claim 2, wherein a dose amount of the ions decreases as an implantation angle increases.

7. The method of claim 2, wherein a dose amount of the ions is constant for each implantation operation.

8. The method of claim 2, wherein a dose amount of the ions is different between one implantation operation and another implantation operation.

9. A method of manufacturing a semiconductor device, comprising:
forming fin structures each having an upper portion and a lower portion, the lower portion being embedded in an isolation insulating layer disposed over a substrate and the upper portion protruding from the isolation insulating layer;
forming a dummy gate structure over the fin structures;
forming sidewall spacers on opposing sides of the dummy gate structure;
removing the dummy gate structure, thereby exposing the upper portion of each of the fin structures;
forming a gate dielectric layer over the exposed upper portion of each of the fin structures;
forming a conductive layer over the gate dielectric layer;
forming a cap layer over the conductive layer; and
performing an ion implantation operation on channel regions of the fin structures with the cap layer,
wherein the ion implantation operation is performed multiple times using different implantation angles to introduce ions into one side surface of each of the channel regions of the fin structures.

10. The method of claim 9, wherein:
the fin structures extend in an X direction, and
an angle θ of each of the different implantation angles is defined as an acute angle made by a normal direction, which is a Z direction, of a main surface of a substrate and an ion beam direction in a ZY plane made by the Z direction and a Y direction, where the Y direction is perpendicular to the Z direction and the X direction.

11. The method of claim 10, wherein fluorine ions are implanted into the fin structures by the ion implantation operation.

12. The method of claim 11, wherein the cap layer includes amorphous silicon.

13. The method of claim 11, wherein the conductive layer includes TiN.

14. The method of claim 11, wherein after the conductive layer is formed and before the cap layer is formed, an anneal operation is performed.

15. The method of claim 11, wherein the cap layer is removed after the implantation operation.

16. A method of manufacturing a semiconductor device, comprising:
removing a dummy gate structure, thereby exposing a first fin structure and a second fin structure, each having an upper portion and a lower portion, the lower portion being embedded in an isolation insulating layer disposed over a substrate and the upper portion protruding from the isolation insulating layer, the first fin structure extending in an X direction;
forming a gate dielectric layer over the upper portion of each of the first and second fin structures;
forming a conductive layer over the gate dielectric layer of each of the first and second fin structures;
forming a cap layer over the conductive layer of each of the first and second fin structures; and
performing an ion implantation operation on the first and second fin structures with the cap layer, wherein:
the ion implantation operation is performed multiple times with different implantation angles to introduce ions into one side surface of each of the first and second fin structures.

17. The method of claim 16, wherein at least one of the ion implantation operations is performed at an angle $\theta_0$ with respect to a normal direction of the substrate, where $$\theta_0 = \tan^{-1}(L-W/h),$$

L is a pitch of the first fin structure and the second fin structure, W is a width of the first fin structure and the second fin structure, and h is a height of the first fin structure and the second fin structure from an upper surface of the isolation insulating layer.

18. The method of claim 16, wherein one of the different implantation angles is an angle θ, and an ion implantation operation at the angle θ is performed twice by rotating the substrate 180 degrees.

19. The method of claim 18, wherein a difference between two of the implantation angles is 1.5 degrees to 3.0 degrees.

20. The method of claim 18, wherein fluorine ions are implanted into the first and second fin structures by the ion implantation operation.

* * * * *